United States Patent
Bailey et al.

(10) Patent No.: US 9,474,181 B2
(45) Date of Patent: Oct. 18, 2016

(54) COMBINED POWER AND MANAGEMENT MODULE FOR USE IN A RACK-CONFIGURED INFORMATION HANDLING SYSTEM

(71) Applicant: DELL, INC., Round Rock, TX (US)

(72) Inventors: Edmond Bailey, Cedar Park, TX (US); Jimmy Pike, Georgetown, TX (US); Joseph Andrew Vivio, Santa Rosa, CA (US); John R. Stuewe, Round Rock, TX (US)

(73) Assignee: DELL PRODUCTS, L.P., Round Rock, TX (US)

( * ) Notice: Subject to any disclaimer, the term of this patent is extended or adjusted under 35 U.S.C. 154(b) by 0 days.

(21) Appl. No.: 14/139,835

(22) Filed: Dec. 23, 2013

(65) Prior Publication Data

US 2016/0044819 A1  Feb. 11, 2016

(51) Int. Cl.
| | |
|---|---|
| *H05K 7/20* | (2006.01) |
| *H05K 7/14* | (2006.01) |
| *H02J 9/06* | (2006.01) |
| *G06F 1/18* | (2006.01) |

(52) U.S. Cl.
CPC ............. *H05K 7/1492* (2013.01); *G06F 1/18* (2013.01); *H02J 9/06* (2013.01)

(58) Field of Classification Search
CPC ............ H05K 7/1457; H05K 7/1467; H05K 7/1482; H05K 7/1492; G06F 1/188; G06F 1/189
See application file for complete search history.

(56) References Cited

U.S. PATENT DOCUMENTS

| | | | | |
|---|---|---|---|---|
| 6,927,974 B2 * | 8/2005 | Robillard | ............... | H05K 7/183 361/679.4 |
| 8,570,180 B2 * | 10/2013 | Ma | ............ | G06F 1/181 340/635 |
| 8,767,382 B2 * | 7/2014 | Mori | ........... | H05K 7/1492 211/22 |
| 8,817,464 B2 * | 8/2014 | Jau | ........... | H05K 7/1492 361/679.48 |
| 9,019,707 B2 * | 4/2015 | Xu | ............ | H05K 7/1492 312/223.2 |
| 2004/0062002 A1 * | 4/2004 | Barringer | ........... | G06F 1/18 361/679.4 |
| 2005/0071689 A1 * | 3/2005 | Coward | ........... | G06F 1/189 713/300 |
| 2006/0039108 A1 * | 2/2006 | Chikusa | ........... | G06F 1/20 361/695 |
| 2006/0082222 A1 * | 4/2006 | Pincu | ........... | H02J 1/102 307/29 |
| 2007/0268634 A1 * | 11/2007 | Gjerde | ........... | H01R 31/02 361/18 |
| 2008/0122289 A1 * | 5/2008 | Best | ........... | H05K 7/1457 307/25 |
| 2010/0290604 A1 * | 11/2010 | Wright | ........... | H05K 13/0023 379/102.04 |

(Continued)

*Primary Examiner* — Anthony Q Edwards
(74) *Attorney, Agent, or Firm* — Isidore, PLLC

(57) ABSTRACT

A scalable power and management module (PMM) includes a chassis configured to be slideably inserted into a power and management bay within a rack. The PMM provides scalable power distribution and rack-level management functions that are shared by several information technology (IT) gear. Several power supply units (PSUs) are mounted in the chassis. The number of PSUs is scalable based on the number of IT gear. A management controller is mounted in the chassis to provide rack-level management of the IT gear and at least one associated block controller within the rack. A power controller is mounted in the chassis and is communicatively coupled to the PSUs and the management controller. The power controller controls power functions of the PMM.

22 Claims, 13 Drawing Sheets

(56) References Cited

U.S. PATENT DOCUMENTS

| | | | |
|---|---|---|---|
| 2011/0154085 A1* | 6/2011 | Rickard | G06F 1/325 713/340 |
| 2012/0170175 A1* | 7/2012 | Silberbauer | H05K 7/1432 361/637 |
| 2013/0017699 A1* | 1/2013 | Li | G06F 1/188 439/212 |
| 2013/0039006 A1* | 2/2013 | Li | H05K 7/20736 361/679.48 |
| 2013/0063894 A1* | 3/2013 | Wang | H05K 7/1492 361/692 |
| 2013/0077209 A1* | 3/2013 | Su | H05K 7/1492 361/622 |
| 2013/0107436 A1* | 5/2013 | Li | H05K 7/1492 361/679.4 |
| 2013/0111098 A1* | 5/2013 | Li | G06F 1/188 710/305 |
| 2013/0135805 A1* | 5/2013 | Wang | H05K 7/1492 361/679.02 |
| 2013/0179718 A1* | 7/2013 | Jau | G06F 1/263 713/340 |
| 2013/0198534 A1* | 8/2013 | Bailey | G06F 1/30 713/300 |
| 2013/0249286 A1* | 9/2013 | Hou | G06F 1/26 307/18 |

* cited by examiner

COMBINED POWER AND MANAGEMENT MODULE FOR USE IN A RACK-CONFIGURED INFORMATION HANDLING SYSTEM

BACKGROUND

1. Technical Field

The present disclosure generally relates information handling systems and in particular to a combined power and management module used in a rack-configured information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Providing power management and cooling to an information handling system is important to prevent loss of data and to maintain system reliability. During operation of an information handling system, events can occur that interrupt or reduce the amount of incoming AC power to the information handling system or the amount of available power from power supplies that deliver electrical power to the information handling system. It is desirable for the information handling system to be able to seamlessly manage both increases and decreases in power demands from the components of the information handling system and to be able to manage interruptions in the delivery of power to the information handling system. Unfortunately, the present power systems for supplying and controlling power in an information handling system take up large amounts of space, require excessive numbers of cables and are difficult to modify if more or less power is required. It is desirable for the power system in an information handling system to be compact and scalable to the power requirements of the information handling system.

BRIEF SUMMARY

Disclosed are a scalable power and management module, an information handling system and a method of constructing a rack-based information handling system having combined power and management within a single module inserted into a rack.

According to one embodiment, a scalable power and management module (PMM) comprises a chassis configured to be slideably inserted into at least one power and management bay within a rack. The PMM provides scalable power distribution and rack-level management functions that are shared by a plurality of IT gear. A plurality of power supply units (PSUs) are mounted in the chassis, where the number of PSUs is scalable based on the number of IT gear. At least one management controller is mounted in the chassis and provides rack-level management of at least one of the IT gear and at least one associated block controller within the rack. A power controller is mounted in the chassis and communicatively coupled to the PSUs and the management controller. The power controller controls power functions of the PMM to control the supply of power to the various IT gear and other components within the rack.

Also disclosed is an information handling system (IHS) that comprises a rack having adjoined exterior frames that create a volumetric space for receiving a plurality of information technology (IT) gear and other functional components. The volumetric space includes a plurality of IT gear slots each configured to receive at least one IT gear. The volumetric space provides at least one power and management bay, which is configured as a separate space from the IT gear slots. At least one power and management module (PMM) is inserted into the at least one power and management bay. The PMM provides scalable power distribution and rack-level management functions that are shared by the plurality of IT gear inserted into the IT gear slots.

According to another embodiment, a method of constructing a rack-based information handling system comprises configuring a rack having adjoined exterior frames that create a volumetric space for receiving a plurality of information technology (IT) gear and other functional components. A plurality of IT gear slots are defined within the volumetric space. Each of the IT gear slots is configured to receive at least one IT gear. At least one power and management bay is defined within the volumetric space and is configured as a separate space from the IT gear slots to receive at least one power and management module (PMM). The at least one power and management module (PMM) is mounted into the at least one power and management bay. The PMM provides scalable power distribution and rack-level management functions that are shared by the plurality of IT gear inserted into the IT gear slots.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
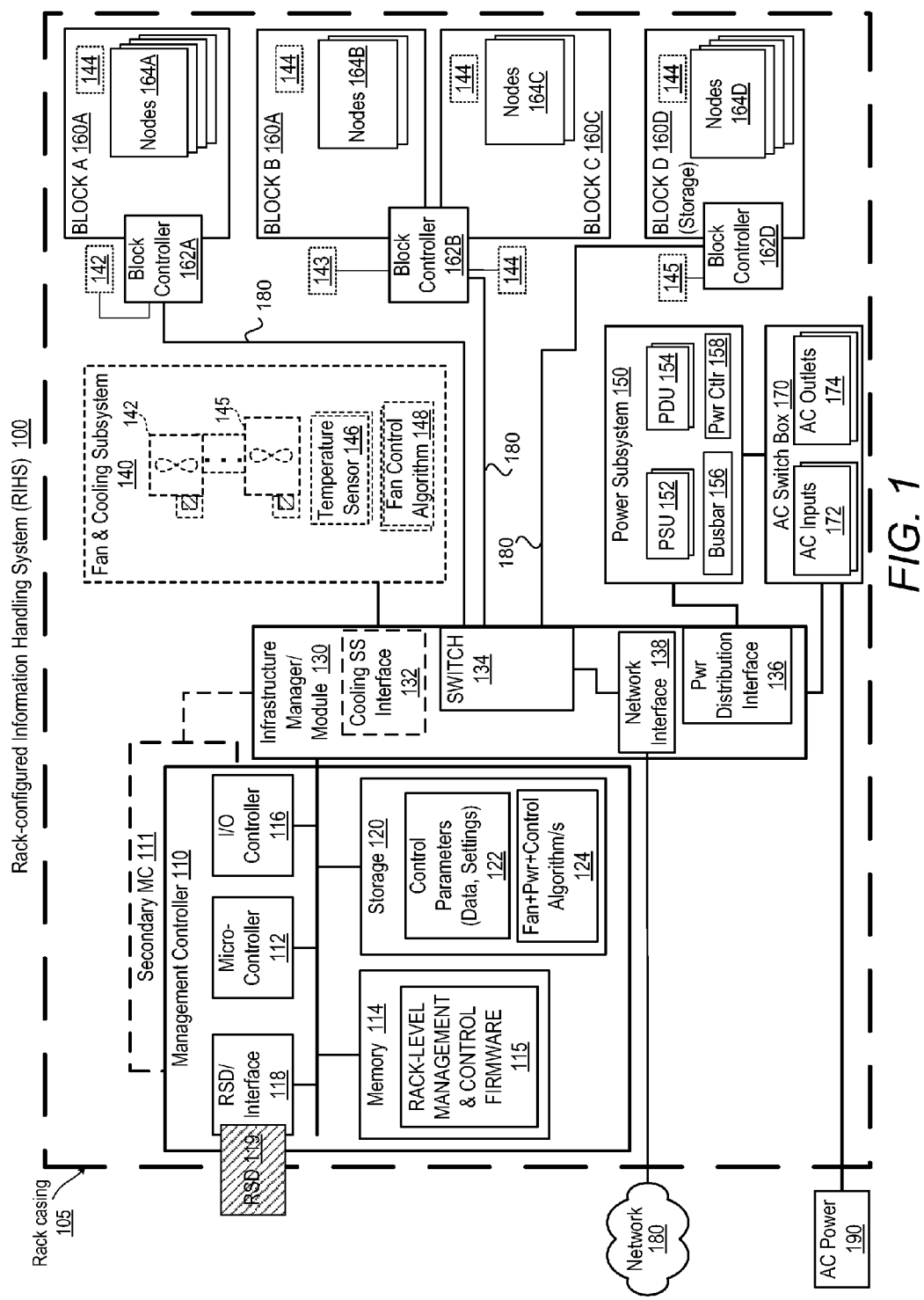
FIG. 1 is a block diagram illustration of an example modular, scalable and expandable (MSE) rack-based information handling system, according to one or more embodiments.

The illustrative embodiments provide a scalable power and management module (PMM), an information handling system (IHS) and a method of constructing a rack-based information handling system with a PMM. The PMM provides scalable power distribution and rack-level management functions that are shared by several IT gear within a rack IHS.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures (e.g. FIG. 1) and described herein may vary. For example, the illustrative components within IHS 100 (FIG. 1) are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

FIG. 1 illustrates a block diagram representation of an example information handling system (IHS) 100, within which one or more of the described features of the various embodiments of the disclosure can be implemented. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, there is illustrated a two-dimensional block diagram of an example rack-based IHS 100 configured within a modular, expandable rack with modular configuration of various functional components inserted therein. As a two-dimensional image, certain of the presented components are shown in different orientations relative to each other for simplicity in describing the connectively of the components. For example, while certain components are shown separate from the power subsystem, in actual implementation, these components can be located on or within a power bay housing several of the components of the power subsystem. Similarly, while the power subsystem is shown with specific components within a single block, these components are not necessarily contained in a unitary structure. For example, the bus bar can be modularly extended along the entire vertical run of the rack with only one sub-section in direct connection with or located within or proximate to the actual power bay. For purposes of the disclosure, all general references to an information handling system shall refer to the MSE rack-based IHS 100, while references to actual processing nodes within the IHS 100 are understood to refer to chassis-level processing nodes or other IT gear that can be located on physical sleds within the various blocks defined within the rack. It is further appreciated that within the MSE rack-based IHS 100 can be multiple, separate domains or computing systems that operate independent of each other and can be assigned to different independent customers and/or users. Even when configured as separate computing systems, however, the rack-based IHS provides rack-level power management and control of these systems as a unitary IHS. The level of detail of the actual use of the processing nodes within the general rack-level IHS 100 is not relevant to the descriptions provided herein and are specifically omitted.

As presented in FIG. 1, IHS 100 comprises rack casing 105, which can comprise one or more panels of sheet metal or other material interconnected to form a three dimensional volume generally referred to in the industry as a rack. The various components are communicatively connected to one or more other components via power and communication cables, which are generally represented by the connecting lines of FIG. 1. IHS 100 comprises a hierarchical arrangement of multiple management modules, along with power and cooling components, and functional processing components or IT gear located within end nodes. At the rack level, IHS 100 includes management controller (MC) 110 communicatively connected to infrastructure manager (IM) 130. MC 110 includes a microcontroller 112 (also generally referred to as a processor) which is coupled via an internal bus to memory 114, I/O interface controller 116, removable storage device (RSD) interface 118 and storage 120. Memory 114 can be flash or other form of memory. Illustrated within memory 114 is rack-level power management and control (RPMC or PMC) firmware 115, which is inclusive of the firmware that controls the operation of MC 110 in communicating with and managing the down-stream components (i.e., blocks and processing nodes, etc.) of IHS 100. I/O interface 116 provides connection points and hardware and firmware components that allow for user interfacing with the MC 110 via one or more connected I/O devices, such as a keyboard, a mouse, and a monitor. I/O interface 116 enables a user to enter commands via, for example, a command line interface (CLI), and to view status information of IHS 100. I/O interface 116 also enables the setting of operating parameters for IHS 100, among other supported user inputs.

RSD interface 118 enables insertion or connection of a RSD 119, such as an SD card containing pre-programmable operating firmware for IHS 100. In at least one embodiment, a RSD 119 stores a copy of the operating parameters of IHS 100 and the RSD 119 can be utilized to reboot the IHS 100 to its operating state following a system failure or maintenance shutdown. Storage 120 can be any form of persistent storage and can include different types of data and operating parameters (settings) 122 utilized for functional operation of IHS 100. Among the stored content within storage 120 can also be algorithms 124 for fan and/or power and/or control. In one or more embodiments, IHS 100 can optionally include at least one other MC, illustrated as second MC 111, to provide a redundant configuration of MCs 110,111, which, in one embodiment, are both simultaneously active and functioning. With this embodiment, the redundant configuration and parallel operation of MCs 110/111 enables IHS 100 to continue operating following a failure of either of the MCs 110/111 or in the event one of the MCs 110/111 has to be taken offline for maintenance.

Infrastructure manager 130 includes cooling subsystem interface 132, Ethernet switch 134, power distribution interface 136 and network interface 138. Network interface 138 enables IHS 100 and specifically the components within IHS 100 to connect to and communicate with or via an external network 180.

In addition to the above-described MC 110 and IM 130, IHS 100 further comprises cooling subsystem 140, power subsystem 150, and a plurality of blocks 160, individually labeled as blocks A-D 160A-160D. In one implementation, each block 160 has an associated block controller (BC) 162. Cooling subsystem 140 includes a plurality of fan modules of which a first fan module 142 and a second fan module 145 are shown. These fan modules 142, 145 are located within a respective fan bay (not shown) and can be different sizes and provide different numbers of fans per module. Also included within cooling subsystem 140 is a plurality of temperature sensors 144, which are further shown distributed within or associated with specific blocks 160. Cooling subsystem of IHS 100 further includes some design features of rack casing 105, such as perforations for air flow and other design features not expanded upon within the present description. Each fan module 142-145 is located behind (or in the air flow path of) a specific block 160 and the fan module 142-145 is communicatively coupled to and controlled by the block controller 162 associated with that block 160. Within each block 160 is at least one, and likely a plurality of processing nodes 164. As one aspect of the disclosure, the number of nodes that can be placed within each block and/or supported by a single block controller can vary up to a maximum number (e.g., 16) based on the block dimension relative to the size and configuration of each processing node. Additionally, as provided by block D 160D, one or more of the blocks can be utilized to provide rack-storage of storage devices. Also, as shown with blocks B 160B and C 160C, a single block controller 162B can be assigned to control multiple blocks, when the number of processing nodes within an individual block does not exceed the pre-established BC threshold. In at least one implementation, the BC threshold can be set to 16 nodes. Each node controlled by a respective BC 162 is communicatively coupled to the BC 162 via one or more cables (not shown).

Switch 134 enables MC 110 to communicate with block controllers 162 via a network of Ethernet cables 180. Specifically, according to at least one embodiment, MC 110 provides certain control and/or management signals to BCs 162 via one or more select wires within the Ethernet cables 180, which select wires are one or more of the additional wires within the Ethernet cable that are not utilized for general system and network communication.

Power subsystem 150 generally includes a plurality of power supply units (PSUs) 152, one or more power distribution units 154 (PDUs), and a modular busbar 156. Power subsystem 150 also includes a source of external power, AC power 190 that supplies AC power to AC switch 170. Each of the individual nodes and other components within IHS 100 that require power are either directly coupled to modular busbar 156 or coupled via power cables to PDUs 154 to obtain power. As one aspect of power distribution within IHS 100, MC 110 can monitor power consumption across the IHS 100 as well as the amount of available power provided by the functional PSUs 152 and MC 110 can trigger changes in power consumption at the block level and ultimately at the (processing) node level based on changes in the amount of available power and other factors. Control of the power subsystem 150 can, in one embodiment, be provided by a separate power controller 158, separate from MC 110. As further illustrated, one additional aspect of the power system for the MSE rack-based IHS 100 provide for the inclusion of AC Switch 170. AC switch 170 is communicatively coupled to both IM 130 and power subsystem 150. AC Switch 170 includes a plurality of AC inputs 172 and a plurality of AC outlets 174 that are utilized to supply power to the PSUs 152, and other functional components of MSE rack-based IHS 100 that require AC power.

Other features and functionality of IHS 100 will be described in greater detail hereafter with reference to one or more of the following figures.

Figure 2:
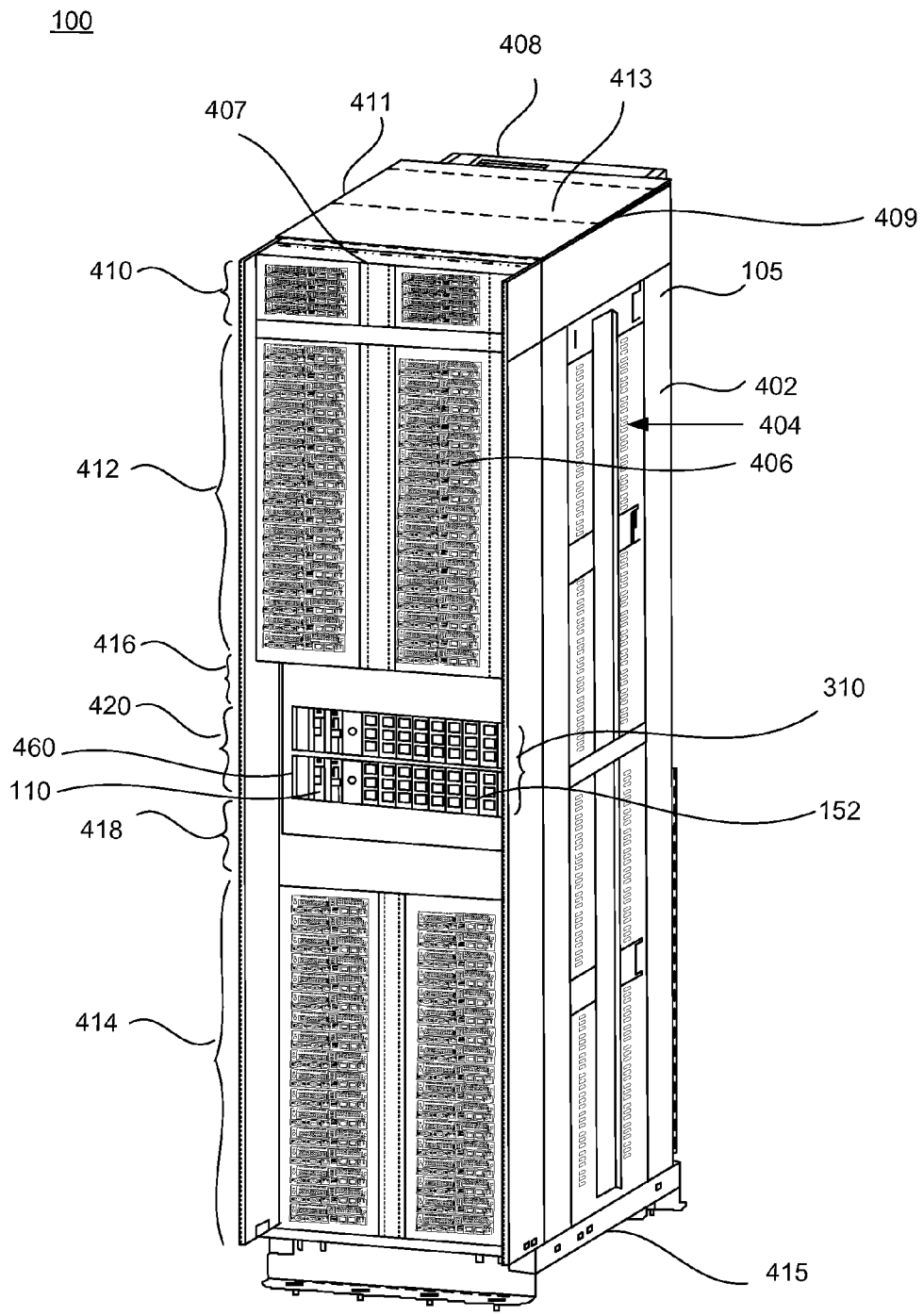
FIG. 2 is a front perspective view illustrating a modular rack having inserted PMMs and IT gear, in accordance with one embodiment.
Figure 3:
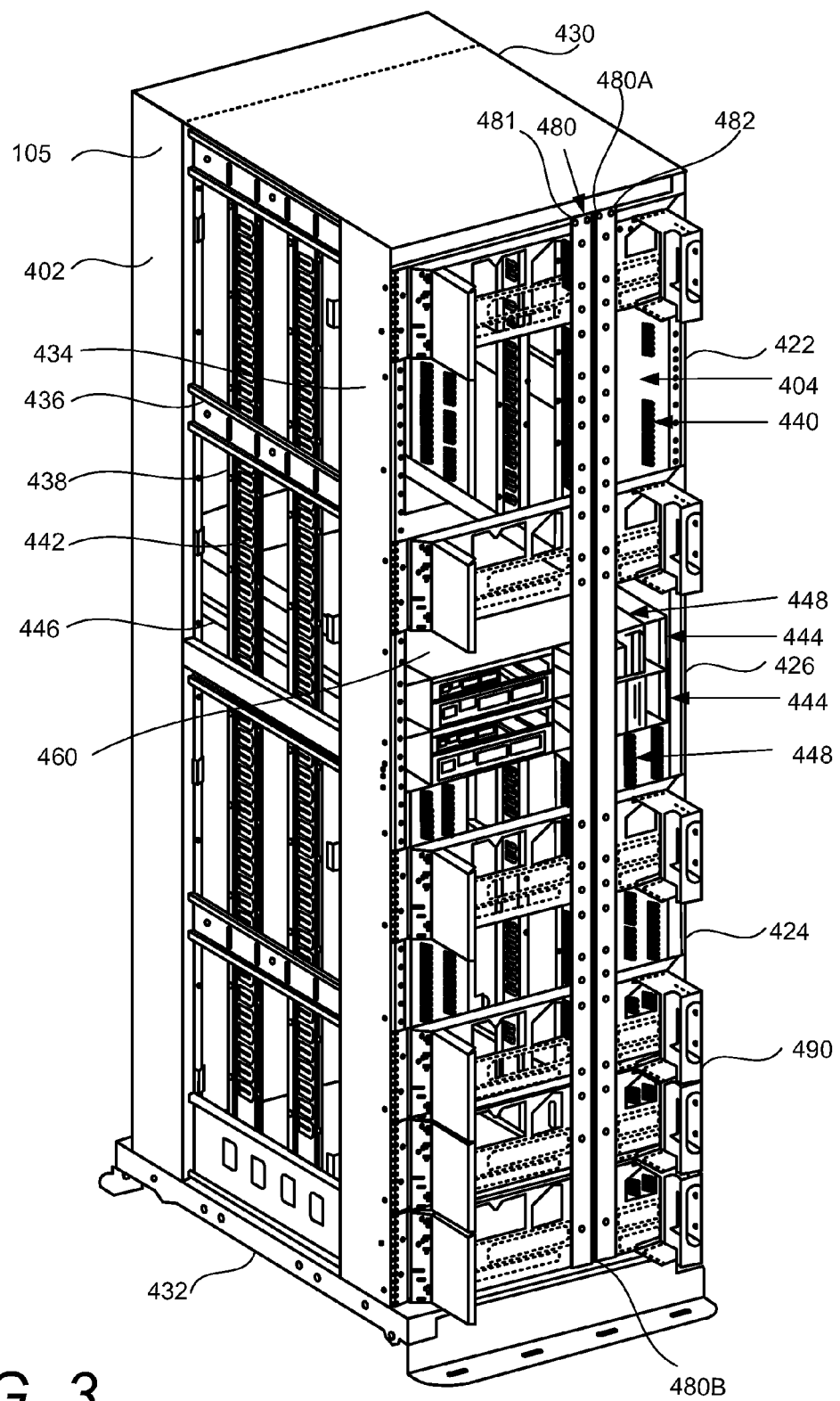
FIG. 3 is a rear perspective view of the modular rack having inserted PMMs and a power bay busbar, in accordance with one embodiment.
Figure 4:
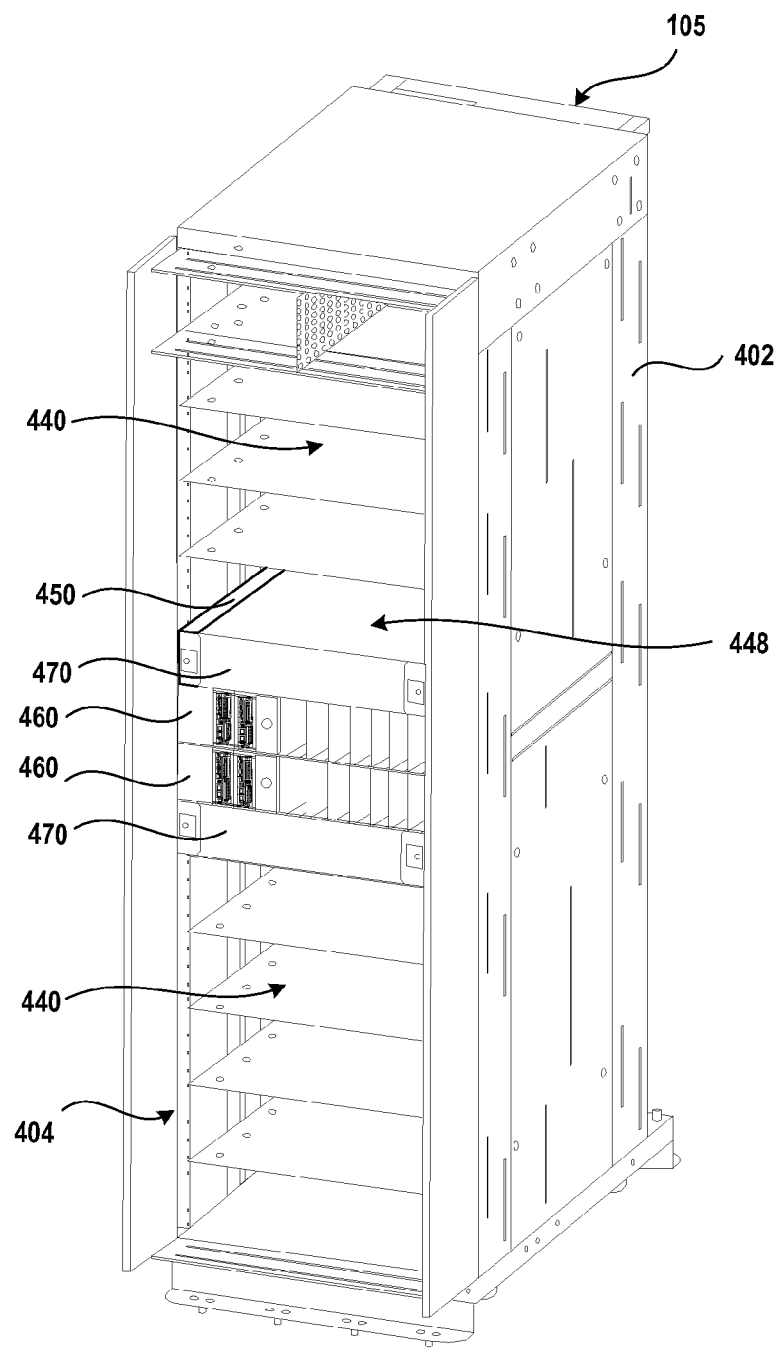
FIG. 4 is a front perspective view illustrating a modular rack having inserted PMMs and switch modules, in accordance with one embodiment.

FIGS. 2, 3 and 4 illustrate details of a modular rack-based IHS 100 having slots and bays containing inserted power and management modules (PMMs) and processing nodes. The figures are described together, with reference numerals for certain components provided as needed on specific ones of the figures, but not necessarily on all of the figures. Referring to FIGS. 2-4, rack-based IHS 100 comprises a rack 105 having adjoined exterior frames 402 that enclose and define a volumetric space 404 for receiving one or more pieces of information technology (IT) gear 406. IT gear 406 can include various computer processing and storage devices such as block controllers 162 and processing nodes 164. Rack 105 has a front side 407, a back or rear side 408, a right side 409 and a left side 411. Rack 105 further has a top side 413 and a bottom side 415. Rack 105 is divided into several zones or sections. Rack 105 has a top IT gear section 410, an upper IT gear section 412, a lower IT gear section 414, two central switch sections 416, 418 and a central power and management section 420.

Adjoined exterior frames 402 include an upper frame 422 that defines upper IT gear section 412, a lower frame 424 that defines lower IT gear section 414, and central frame 426 that defines central switch sections 416, 418 and central power and management section 420. Upper frame 422 is connected to central frame 426 which is connected to lower frame 424.

Frames 402 include a top panel 430, a bottom panel 432, support posts 434 and cross-members 436. Four support posts 434 are arranged vertically with cross members 436 extending between the front and back support posts along opposite sides of frame 402. Top panel 430, is affixed to the top of support posts 434 and bottom panel 432 is affixed to the bottom of support posts 434. Mounting rails 438 are mounted to cross members 436 and are oriented parallel to support posts 434. Mounting rails 438 extend between top panel 430 and bottom panel 432. Upper IT gear section 412 and lower IT gear section 414 have several IT gear slots 440 that are configured to receive at least one of the IT gear 406. IT gear slots 440 are formed by ribs 442 mounted to opposed interior portions of mounting rails 438. The various components of rack 105 can be attached to each other using suitable methods such as welding or by the use of fasteners.

Central frame 426 has power and management bays 444 that are configured as a separate space from the IT gear slots 440. Although FIG. 3 shows two power and management bays 444, rack 105 can have more or fewer power and management bays 444. Slide rails 446 are mounted in power and management bays 444 to support posts 434. Slide rails 446 are perpendicular to support posts 434 and extend across mounting rails 438. Slide rails 446 can move into and out of power and management bays 444. Central frame 426 also has switch bays 448 that are separate from power and management bays 444. One switch bay 448 is located above the upper power and management bay 444 and the other switch bay 448 is located below the lower power and management bay 444. A pair of spaced-apart, opposed, U-shaped channels 450 are mounted perpendicular to cross members 436 in each of the switch bays 448.

A power and management module (PMM) 460 is inserted into and received by each of power and management bays 444. PMM 460 provides scalable power distribution and rack-level management functions that are shared by the IT gear 406 inserted into the IT gear slots 440. Specifically PMM 460 is mounted to slide rails 446 such that PMM 460 can be moved between an inserted or retracted position into power and management bay 444 and an extended position out from power and management bay 444. PMM 460 contains management controllers 110 and PSUs 152 (FIG. 1).

A switch module 470 is inserted into and received by each of switch bays 448. Switch module 470 provides switch communication functions to IHS 100. Specifically switch module 470 is mounted to U-shaped channels 450. A power bay busbar 480 is mounted to the rear side 408 of rack 105. Power bay busbar 480 is a modular assembly that includes several interconnected busbar segments that together extend along the entire length of the rear side 408 of the rack 105, between top side 413 and bottom side 415. Power bay busbar 480 has an upper end 480A and a lower end 480B. Power bay busbar 480 provides power and ground to the IT gear 406 mounted in rack 105. Power bay busbar 480 includes two separate busbars, a power busbar 481 and a ground busbar 482.

Rack 105 further includes fan module holders (or fan bays) 490 mounted to the back side 408 of rack 105. Fan module holders 490 (also referred to as fan bays) are attached to support posts 434 and extend across the back section of IT gear slots 440. Fan module holders 490 are configured to receive a fan module. PMM 460 is accessible from the back side 408 of rack 105, such that the IT gear 406 can be inserted into and made accessible from the front side 407 of the rack 105, independent of and without interfering with access to PMM 460 from the back side 408 of the rack.

Figure 5A:
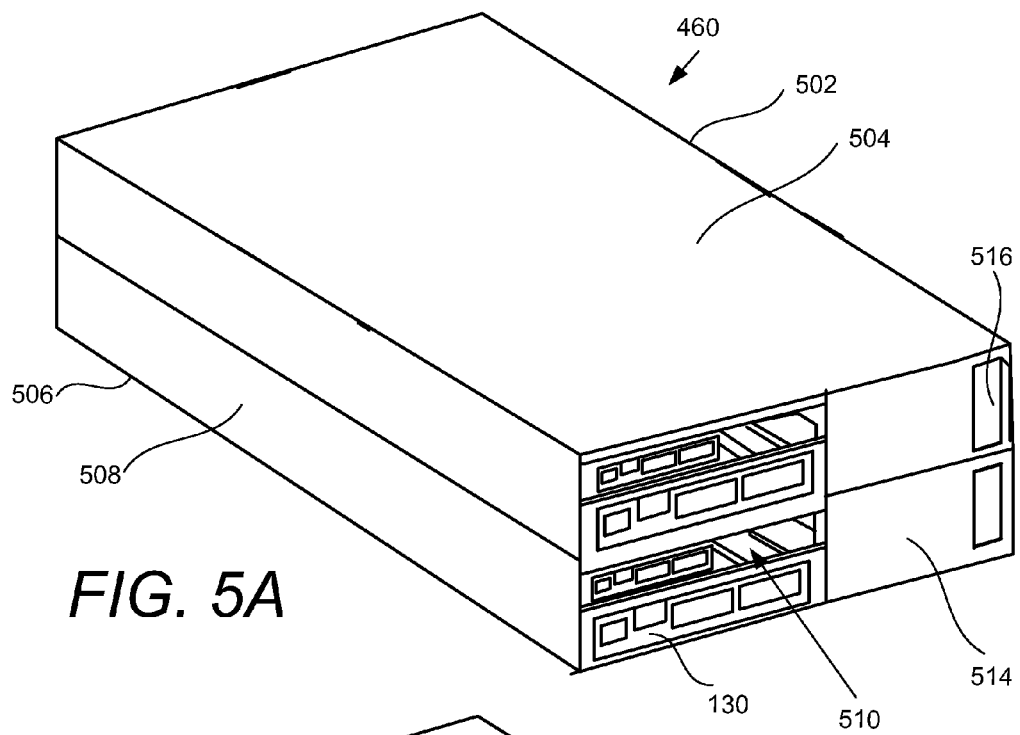
FIG. 5A is a rear perspective view of two stacked PMMs, in accordance with one embodiment.
Figure 5B:
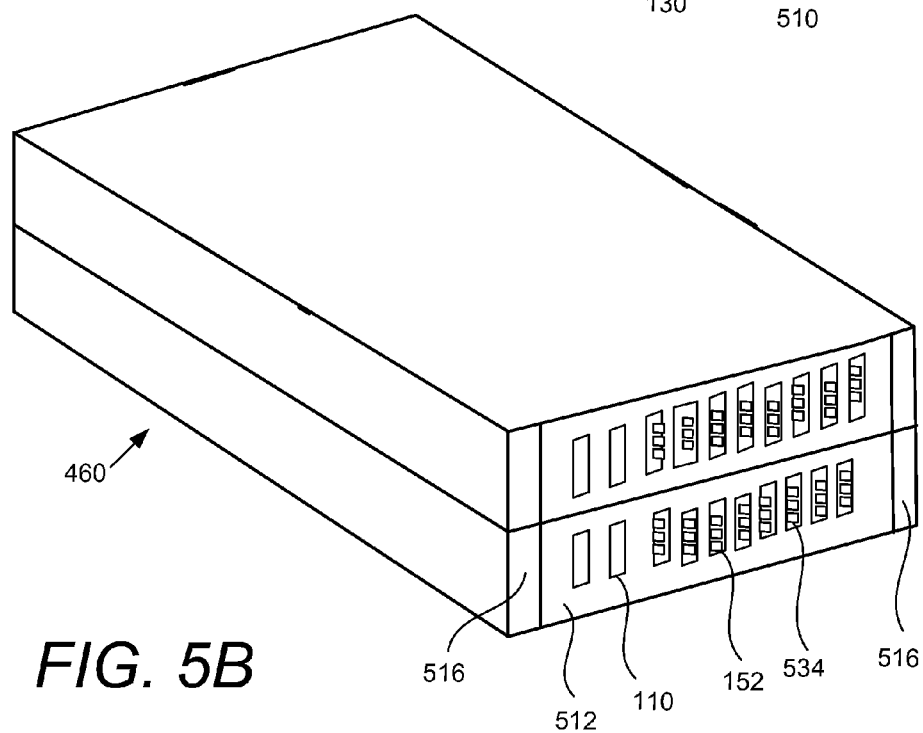
FIG. 5B is a front perspective view of two stacked PMMs, in accordance with one embodiment.
Figures 5C, 5D:
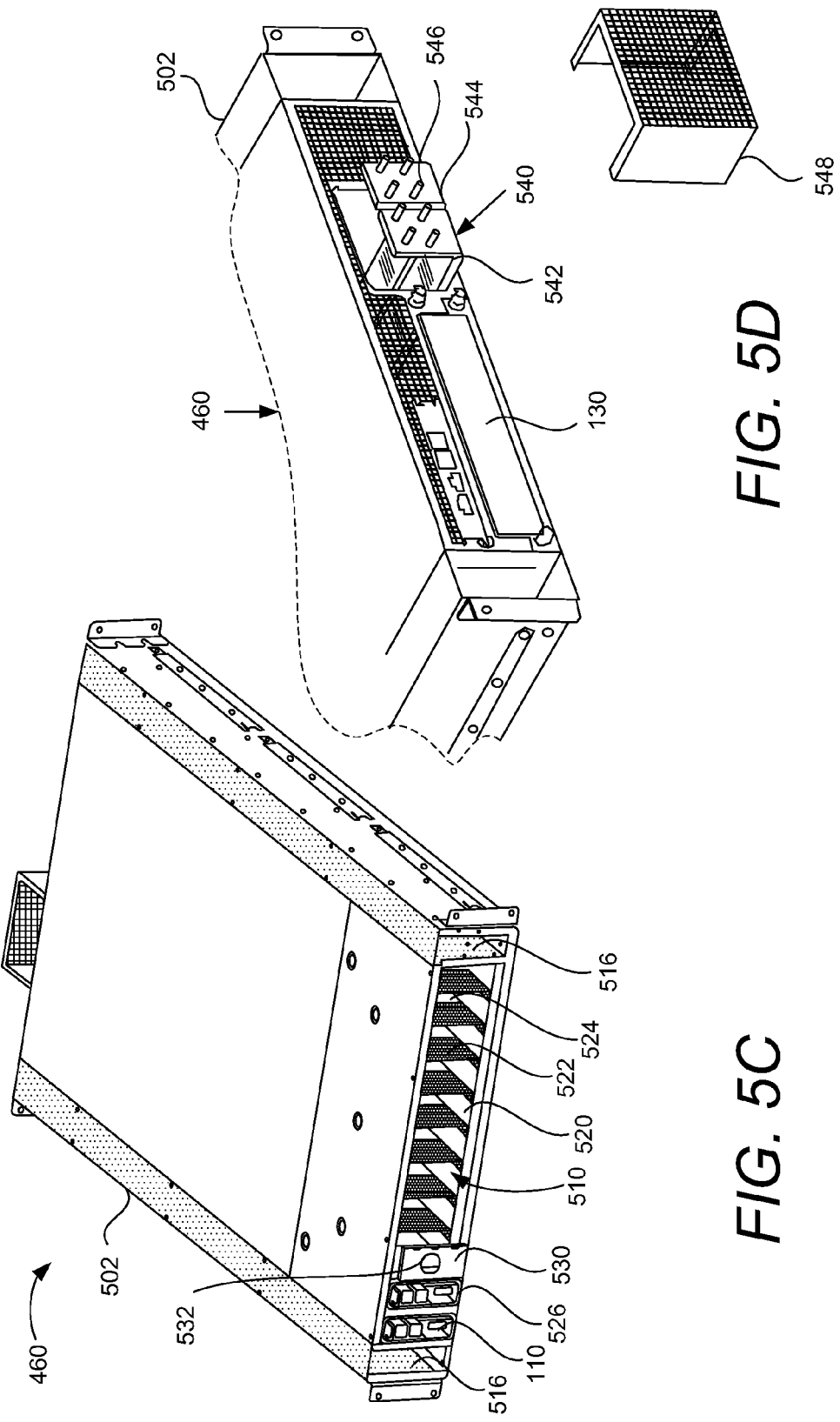
FIG. 5C is a front perspective view of an individual PMM, in accordance with one embodiment.
FIG. 5D is a rear perspective view of an individual PMM, in accordance with one embodiment.

FIGS. 5A-D illustrate details of power and management module (PMM) 460. The figures are described within one unitary description, with reference numerals of some components provided in certain figures but not in others. Referring to FIGS. 5A-D, PMM 460 comprises a housing or chassis 502 formed by a top wall 504, bottom wall 506 and side walls 508 that enclose a cavity 510. The chassis 502 is adapted to be received by the slide rails 446 such that PMM 460 is moveable between a first extended position outside of the power and management bay 444 and a second retracted position within the power and management bay 444. PMM 460 has a front side 512 (FIG. 5B) and a back side 514 (FIG. 5A). Cable routing channels 516 extend through cavity 510 on opposing, exterior sides of chassis 502. Cable routing channels 516 are used to receive and route electrical cables within PMM 460. Several circuit board guide rails 520 (FIG. 5C) are mounted to the inner surface of bottom wall 506 and extend from front side 512 partially towards back side 514. Several dividing walls 522 extend between top wall 504 and bottom wall 506. Dividing walls 522 define a series of power supply slots 524 and management controller slots 526 within chassis 502. Power supply units (PSUs) 152 are mounted in power supply slots 524 and retained by circuit board guide rails 520. The number of PSUs 152 mounted in PMM 460 is scalable based on the number of IT gear 406 in rack 105.

Management controllers (MCs) 110 are mounted in management controller slots 526 and retained by circuit board guide rails 520. A cover 530 is mounted to top wall 504 and bottom wall 506 and extends over PSUs 152. Each cover 530 has a receptacle opening 532. Each PSU 152 has an AC power receptacle 534 that extends through receptacle opening 532. With specific reference to FIG. 5D, an infrastructure manager 130 is mounted in each PMM 460. Infrastructure manager 130 is mounted in cavity 510 towards back side 514. Busbar segment 540 is mounted in cavity 510 towards back side 514. Busbar segment 540 provides a power and ground connection for DC power between PSUs 152 and power bay busbar 480. Busbar segment 540 includes two separate busbar segments, a power or hot busbar segment 542 and a ground busbar segment 544. Bolts 546 extend through both busbar segments 542 and 544 and are used to provide a mechanical and electrical connection to respective power busbar 481 and ground busbar 482. A shield or faraday cage 548 is mounted to the back side of chassis 502 around busbar segment 540. Shield 548 prevents accidental shorts by stopping external objects from coming into contact with power bay busbar 480 and/or busbar segment 540.

Figure 6:
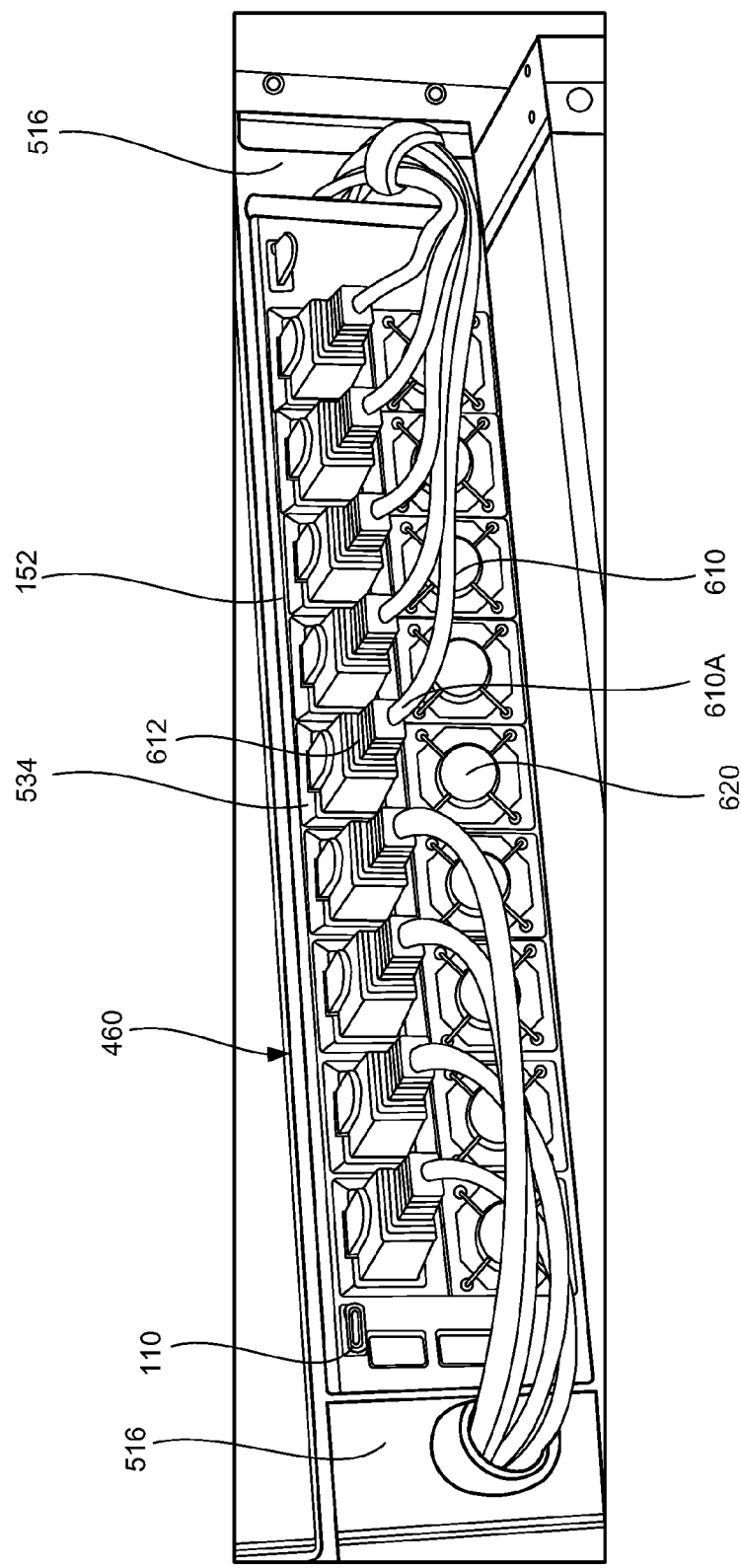
FIG. 6 is a front view of a PMM with attached AC power cables, in accordance with one embodiment.

FIG. 6 illustrates details of PMM 460 with attached AC power cables 610. AC power cables 610 have ends 610A and 610B (see FIG. 8B). End 610A has attached plug 612. Plug 612 is plugged into power supply receptacle 534. AC power cables 610 are routed through cable channel 516 and extend from the front side 512 to the back side 514 of chassis 502 where cable ends 610B are connected to AC switch box 170 (FIG. 1). The AC power cables 610 supply AC power from the AC switch box 170 to the connected PSUs 152. Each PSU 152 has a fan 620 that is mounted to PSU 152. Fan 620 cools the components of PSU 152 when PSU 152 is in operation.

Figure 7:
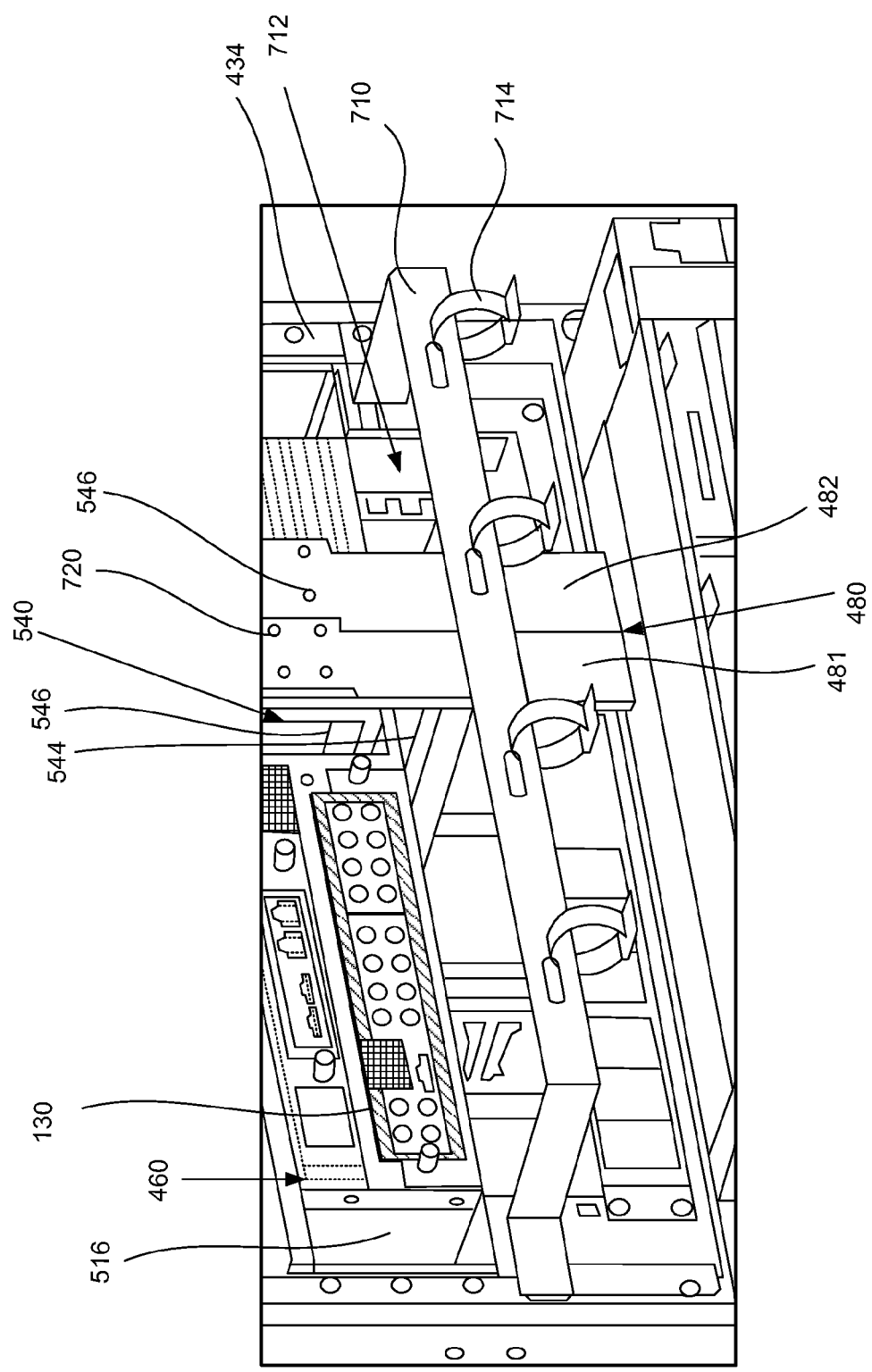
FIG. 7 is an enlarged rear perspective view of the modular rack illustrating details of the cable bar tie-bar and busbar segments, in accordance with one embodiment.

With reference to FIG. 7, additional details of PMM 460 are shown. Busbar segment 540 is connected to power bay busbar 480. Busbar segment 540 provides a power and ground connection for DC power between PSUs 152 and power bay busbar 480. Busbar segment 540 includes two separate busbar segments, a power busbar segment 542 and a ground busbar segment 544. Threaded bolts 546 extend through busbar segments 542 and 544 and are received by threaded apertures 720 in power busbar 481 and ground busbar 482.

A cable tie-bar 710 has ends attached by fasteners to support members 434 of rack 105. Cable tie-bar 710 is used to provide an attachment point for cables such as AC power cables 610 (FIG. 6) run within rack 105. Cable tie-bar 710 defines a cable channel through which cables can be routed. A cable tie 714 can further be mounted to tie-bar 710 to retain cables to tie-bar 710.

Figure 8A:
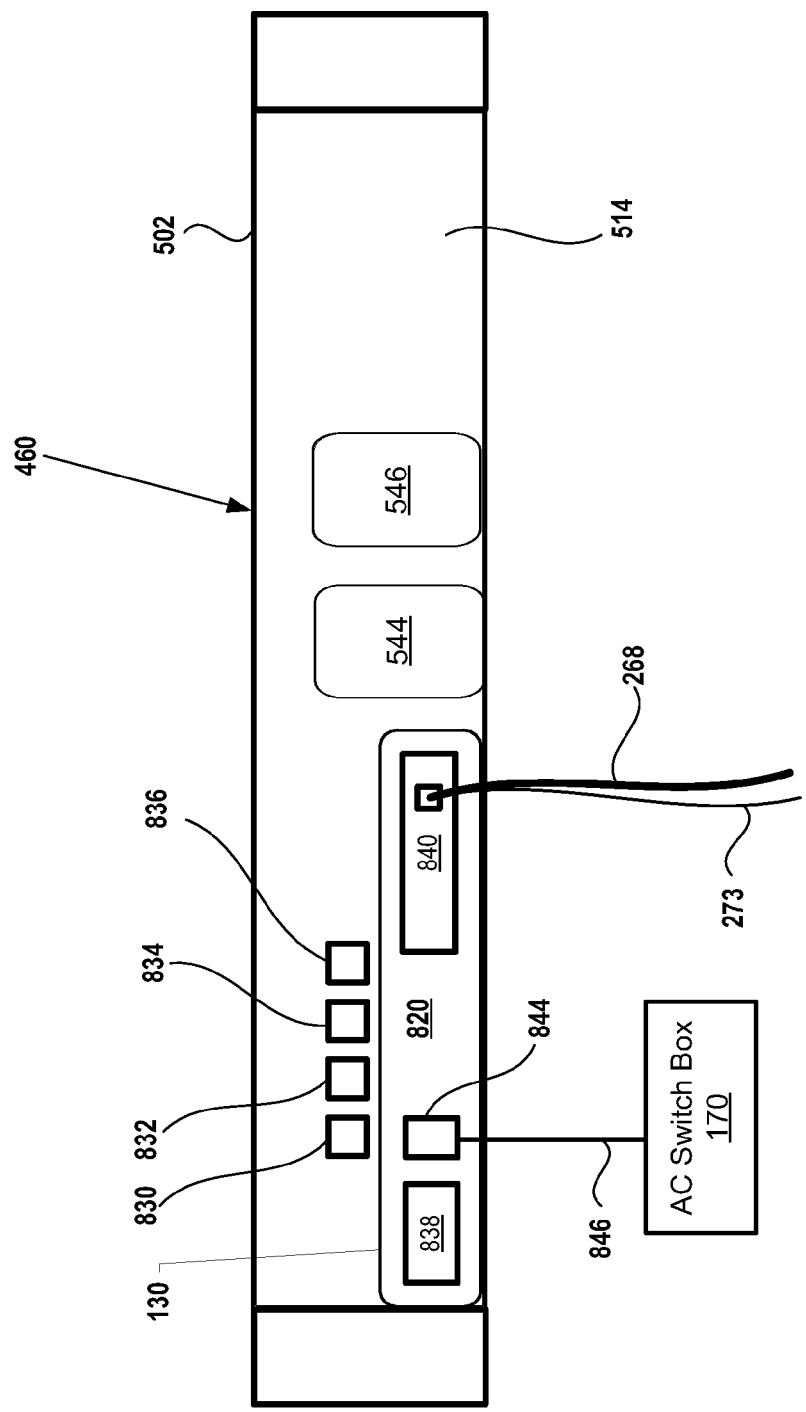
FIG. 8A is a rear view of a PMM, in accordance with one embodiment.
Figure 8B:
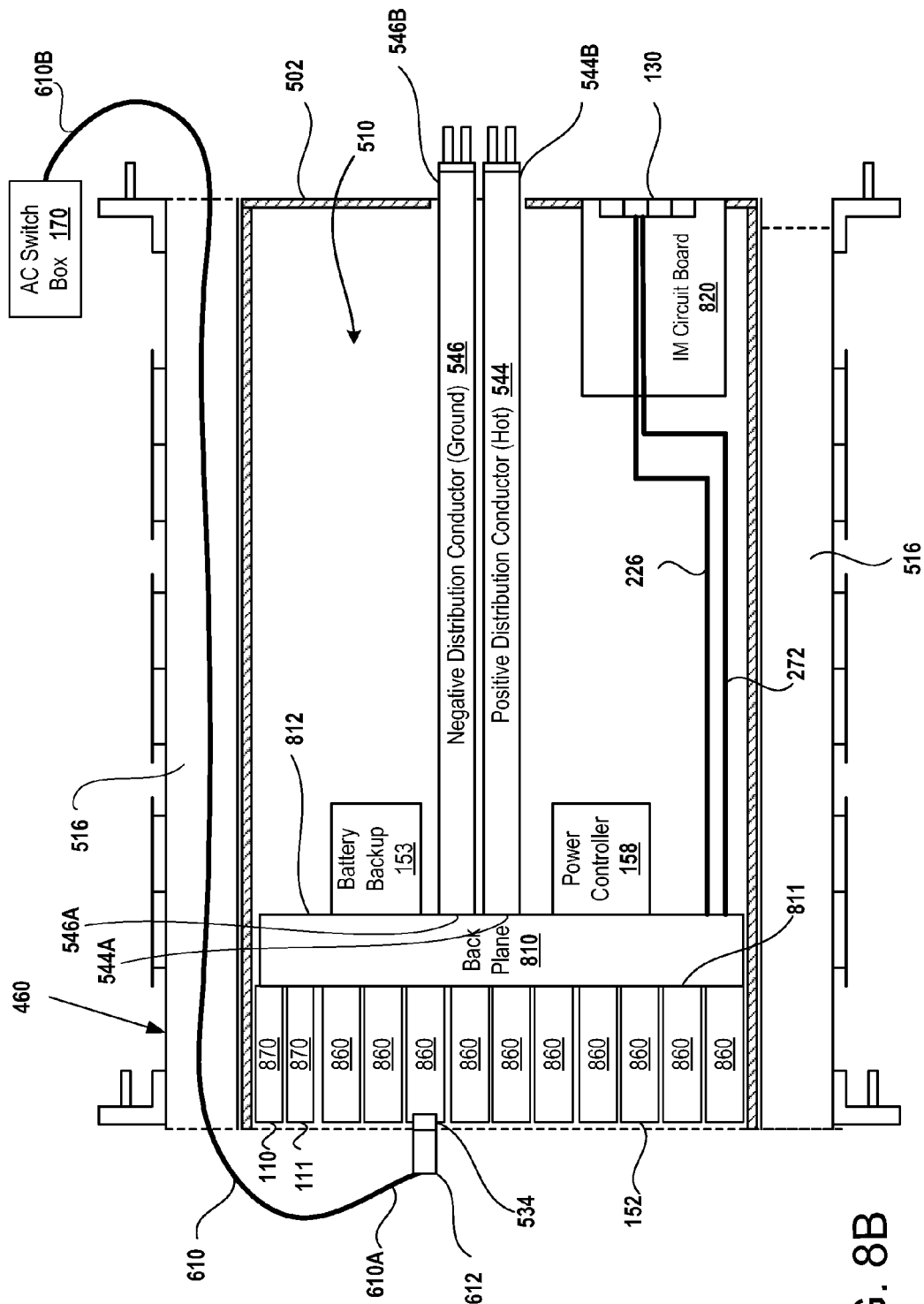
FIG. 8B is a top cross-sectional view of a PMM, in accordance with one embodiment.

With reference now to FIGS. 8A and 8B, further details of PMM 460 are shown. Infrastructure manager (IM) 130 is mounted in chassis 502. IM 130 includes an IM printed circuit board 820 that contains electronic components that implement the functions performed by IM 130. The IM circuit board 820 is mounted in chassis 502 and connected to MC 110 and/or MC 111 by Ethernet cable 226 via backplane 810. IM circuit board 820 has several attached connectors including a battery connector 830, an MC connector 832, an Ethernet MC1 connector 834, an Ethernet MC2 connector 836, a serial connector 838 and an Ethernet connector 840. Battery connector 830 is connected by a cable to backup battery 153. MC connector 832 is connected by a cable to MC 110. Ethernet MC1 connector 834 is connected by an Ethernet cable 226 to MC 110. Ethernet MC2 connector 836 is connected by another Ethernet cable to MC 111. Serial connector 838 is connected to a serial bus by a cable. Connector 844 is connected to AC switch box 170 by a cable 846.

Ethernet connectors 834, 836 and 840 are positioned to face toward a back side 514 of chassis 502. Ethernet connector 840 is connected to Ethernet cable 268 having an allocated global throttle wire 273 directly connecting a plurality of block controllers 162 (FIG. 1) within the rack 105 with the management controller 110. The global throttle wire 273 provides communication of a global throttle power reduction (GTPR) signal from the IM 130 to the specific associated block controller 162. The block controllers 162 within IHS 100 are pre-programmed to respond to an assertion of a signal on the global throttle wire 273 by the management controller 110 by immediately throttling operations of one or more of the IT gear 406.

Backplane 810 is mounted in chassis 502. Backplane 810 is a printed circuit board with multiple ground, power and signal layers. Backplane 810 has a front side 811 and a back side 812. Each of PSUs 152 include a power supply circuit board 860 that is received by and connected to a connector receptacle mounted to front side 811. Each MC 110, 111 includes a management controller circuit board 870 that is received by and connected to a connector receptacle mounted to backplane front side 811. Backup battery 153 and power controller 158 are connected to the backplane back side 812. Power busbar segment 544 and ground busbar segment 546 have respective proximal ends 544A and 546A that are connected to the backplane back side 812. The distal ends 544B and 546B of the busbar segments are connected to respective power bay busbars 481 and 482. AC power cables 610 have ends 610A and 610B. End 610A has attached plug 612. Plug 612 is plugged into power supply receptacle 534 that is connected to power supply circuit board 860. AC power cables 610 are routed through cable channel 516 and extend from the front side 512 to the back side 514 of chassis 502 where cable ends 610B are connected to AC switch box 170. The AC power cables 610 supply AC power from the AC switch box 170 to the connected PSUs 152.

Figure 9:
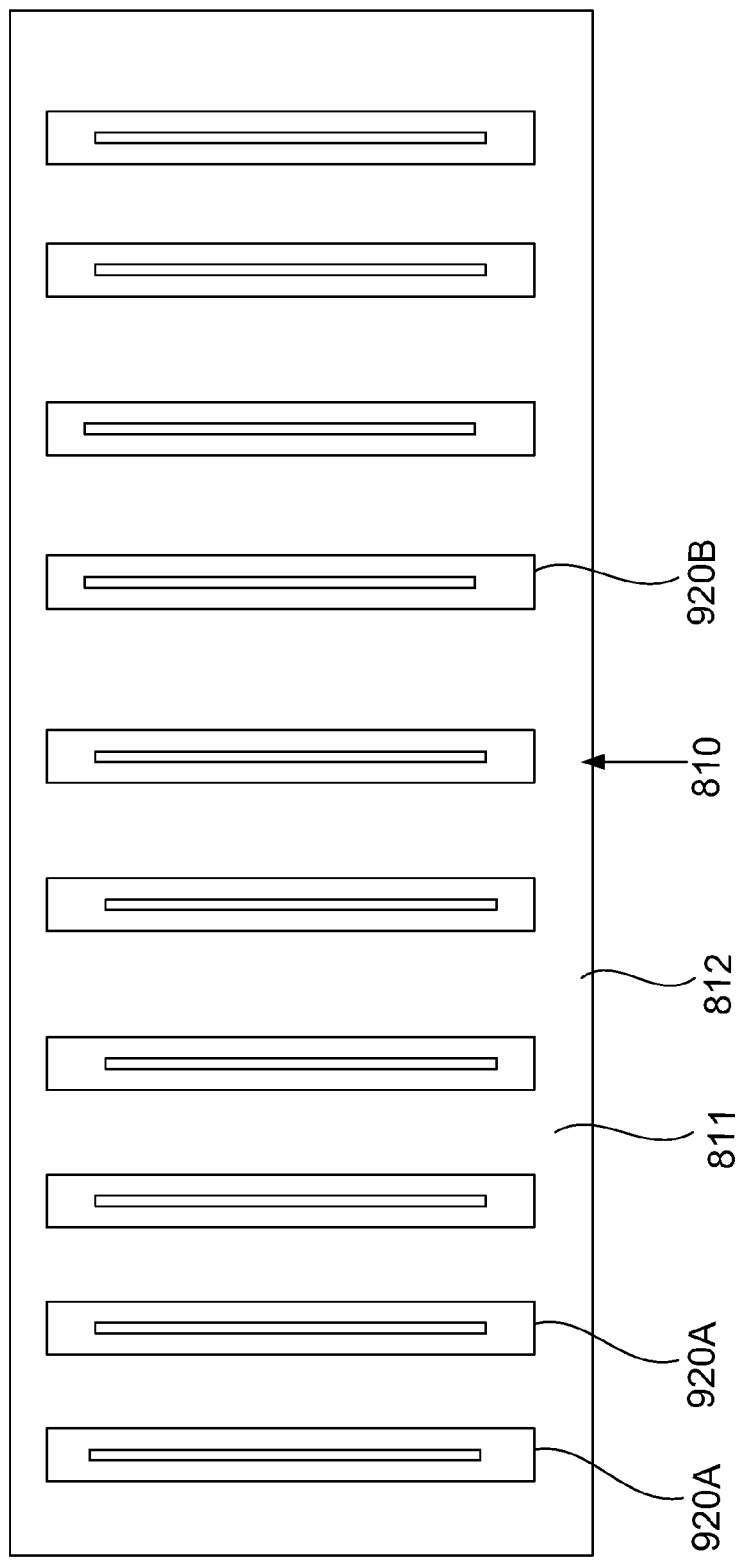
FIG. 9 is a front view of a backplane with connector receptacles.

FIG. 9 illustrates details of backplane 810. Backplane 810 has a front side 811 and a back side 812. Several connector receptacles 920 are mounted to front side 811. Connector receptacles 920 include management controller circuit board receptacles 920A and power supply circuit board receptacles 920B. Management controller circuit board receptacles 920A are adapted to receive management controller circuit boards 870. Power supply circuit board receptacles 920B are adapted to receive power supply circuit boards 860.

Figure 10B:
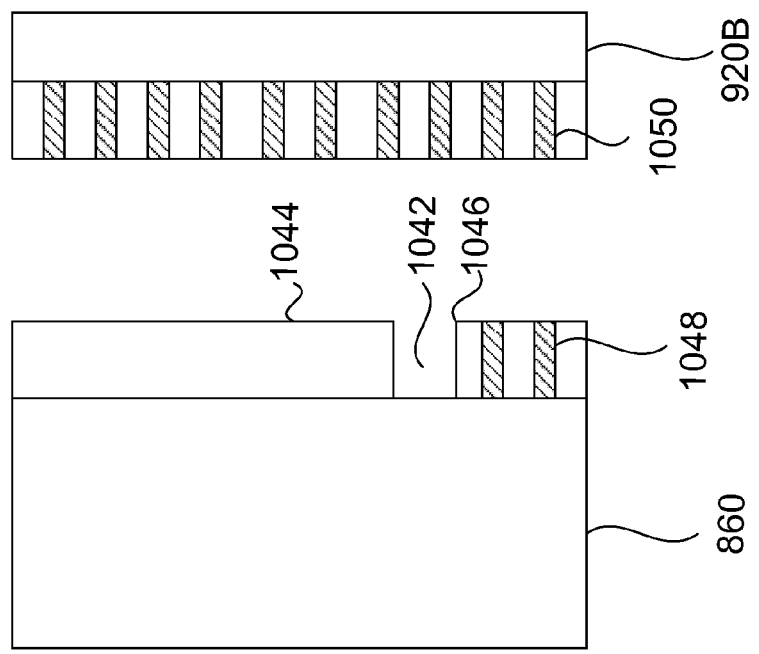
FIG. 10B is a side view of a power supply circuit board and backplane connector receptacles in accordance with one embodiment.
Figure 10A:
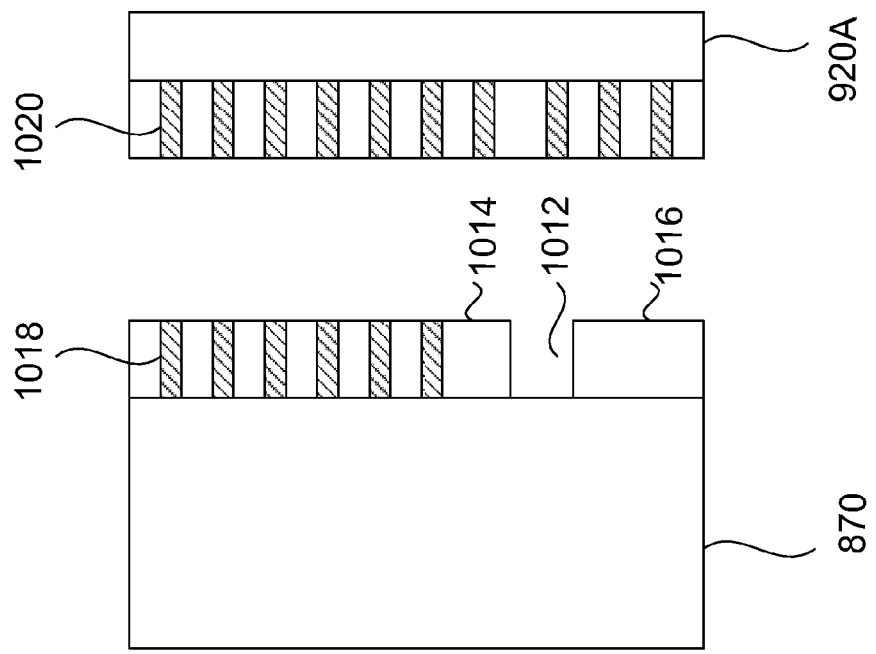
FIG. 10A is a side view of a management controller circuit board and backplane connector receptacles in accordance with one embodiment.

FIGS. 10A-B illustrate details of management controller circuit board 870 and power supply circuit board 860. Management controller circuit board 870 includes an orientation slot 1012, a narrow end 1016 and a wide end 1014. Wide end 1014 has several terminals 1018 formed thereon. Terminals 1018 are connected to printed circuit lines (not shown). Management controller circuit board receptacle 920A has sockets 1020. When management controller circuit board 870 is inserted into management controller circuit board receptacle 920A, terminals 1018 mate with sockets 1020 to form an electrical connection.

Power supply circuit board 860 includes an orientation slot 1042, a narrow end 1046 and a wide end 1044. Wide end 1044 has several terminals 1048 formed thereon. Terminals 1048 are connected to printed circuit lines (not shown). Power supply circuit board receptacle 920B has sockets 1050. When power supply circuit board 860 is inserted into power supply circuit board receptacle 920B, terminals 1048 mate with sockets 1050 to form an electrical connection. According to one aspect of the disclosure, management controller circuit boards 870 can be oriented and inserted into circuit board receptacle 920A in a first orientation, while power supply circuit boards 860 can be inverted 180 degrees from management controller circuit boards 870 and inserted into circuit board receptacle 920B.

Figure 11:
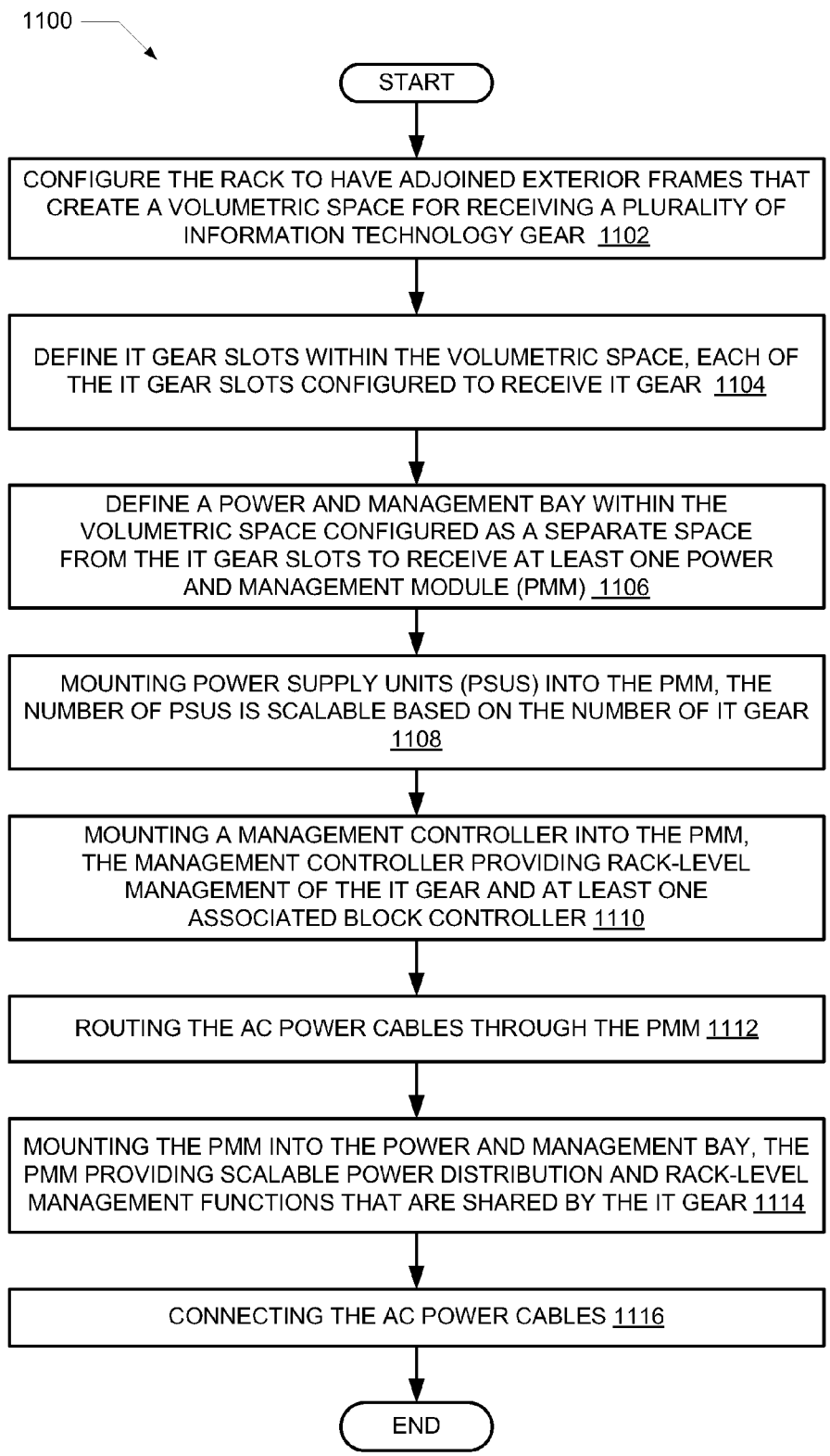
FIG. 11 is a flow chart illustrating one example of a method for constructing a rack-based information handling system with a combined PMM, according to one or more embodiments.

FIG. 11 illustrates a flowchart of an exemplary method for constructing a rack-based information handling system. The description of method 1100 is provided with general reference to the specific components illustrated within the preceding FIGS. 1-10. With specific reference to FIG. 11, method 1100 begins at the start block and proceeds to block 1102 where rack 105 is configured to have adjoined exterior frames 402 that create a volumetric space 404 for receiving a plurality of information technology (IT) gear 406 and other functional components. A plurality of IT gear slots 440 are defined within the volumetric space 404 (block 1104). Each of the IT gear slots 440 are configured to receive at least one IT gear 406. A power and management bay 444 is defined within the volumetric space 404 (block 1106) and is configured as a separate space from the IT gear slots 440 to receive at least one power and management module (PMM) 460. A plurality of power supply units (PSUs) 152 are mounted into the PMM 460 (block 1108). The number of PSUs is scalable based on the number of IT gear 406. A management controller 110, 111 is mounted into the PMM 460 (block 1110). The management controller 110, 111 provides rack-level management of the IT gear 406 and at least one associated block controller 162 within the IHS 100. AC power cables 610 are routed through PMM 460 (block 1112). PMM 460 is mounted into the power and management bay 444 (block 1114). PMM 460 provides scalable power distribution and rack-level management functions that are shared by the plurality of IT gear 406 inserted into the IT gear slots 440. The AC power cables 610 are connected to the PSUs 152 and the AC switch box 170 (block 1116). Method 1100 then ends.

In the above described flow chart, certain steps of the methods can be combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions in a rack design software, for example. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A scalable power and management module (PMM) comprising:
    a chassis configured to be slideably inserted into at least one power and management bay within a rack, the PMM providing scalable power distribution and rack-level management functions that are shared by a plurality of IT gear;
    a plurality of power supply units (PSUs) mounted in the chassis, wherein the number of PSUs is scalable based on the number of IT gear;
    at least one management controller mounted in the chassis that provides rack-level management of at least one of the IT gear and at least one associated block controller within the rack;
    a power controller mounted in the chassis and communicatively coupled to the PSUs and the at least one management controller, the power controller controlling power functions of the PMM;
    an infrastructure manager circuit board mounted in the chassis and connected to the management controller by a first Ethernet cable; and
    at least one Ethernet connector mounted to the infrastructure manager circuit board, the Ethernet connector facing toward a back side of the chassis, the Ethernet connector connected to a second Ethernet cable having an allocated global throttle wire directly connecting a plurality of block controllers within the rack with the management controller, wherein the block controllers within the IHS are pre-programmed to respond to an assertion of a signal on the global throttle wire by the management controller by immediately throttling operations of one or more of the IT gear.

2. The PMM of claim 1, further comprising:
    a backplane;
    a plurality of connector receptacles mounted to the backplane;
    a power supply circuit board mounted in each of the PSUs, the power supply circuit board received by and connected to one of the connector receptacles; and
    a management controller circuit board mounted in each of the at least one management controller, the management controller circuit board received by and connected to one of the connector receptacles.

3. The PMM of claim 2, wherein the power supply circuit board is inserted into a first connector receptacle with a first orientation and the management controller circuit board is inserted into a second connector receptacle with a second orientation, the first and second orientations being inverted relative to each other.

4. The PMM of claim 1, further comprising:
    at least one power bay busbar connected to the PSUs and positioned at the back of the PMM to electrically connect to one or more busbar segments to conduct electrical power from at least one of the plurality of PSUs to IT gear located adjacent to one of the one or more busbar segments, wherein the IT gear is configured with a power tap to electrically connect to a section of the adjacent bus bar segment and distribute received electrical power to IT gear components.

5. The PMM of claim 1, wherein the chassis further comprises:
    a plurality of walls enclosing at least one cavity; and
    at least one cable routing channel extending through the chassis of the PMM for receiving one or more AC power cables.

6. The PMM of claim 5, further comprising:
    an AC switch box;
    an AC power receptacle connected to each of the PSUs; and
    at least one AC power cable routed through the cable routing channel and having a first end connected to the AC switch box and a second end connected to the AC power receptacle, the AC power cable supplying AC power from the AC switch box to the connected PSUs.

7. The PMM of claim 1, further comprising:
    at least one backup battery connected to the PSUs for supplying backup electrical power to the PSUs.

8. The PMM of claim 1, further comprising:
    a plurality of slideable rails located within the power and management bay and coupled to the chassis, the chassis adapted to be received by the slideable rails such that the PMM is moveable between a first extended position outside of the power and management bay and a second retracted position within the power and management bay.

9. The PMM of claim 1, wherein the rack has a front side and a back side, the power and management bay being accessible from the back side, such that the IT gear can be inserted to and made accessible from the front side of the rack, independent of and without interfering with access to the PMM from the back side of the rack.

10. An information handling system (IHS) comprising:
a rack having adjoined exterior frames that create a volumetric space for receiving a plurality of information technology (IT) gear and other functional components, the volumetric space including:
a plurality of IT gear slots each configured to receive at least one IT gear;
at least one power and management bay configured as a separate space from the IT gear slots; and
at least one power and management module (PMM) inserted into the at least one power and management bay, the PMM providing scalable power distribution and rack-level management functions that are shared by the plurality of IT gear inserted into the IT gear slots, wherein the PMM further comprises:
an infrastructure manager circuit board connected to the management controller by at least one Ethernet cable;
at least one Ethernet connector mounted to the infrastructure manager circuit board, the Ethernet connector facing toward a back side of the rack, the Ethernet connector connected to a second Ethernet cable having an allocated global throttle wire directly connecting each block controller within the IHS with the management controller, wherein the block controllers within the IHS are pre-programmed to respond to an assertion of a signal on the global throttle wire by the management controller by immediately throttling operations of one or more processing nodes within a respective block being controlled by the block controller.

11. The IHS of claim 10, wherein the PMM comprises:
a plurality of power supply units (PSUs), wherein the number of PSUs is scalable based on the number of IT gear; and
at least one management controller that provides rack-level management of the IT gear and at least one associated block controller within the IHS.

12. The information handling system of claim 11, the PMM further comprising:
a backplane;
a plurality of connector receptacles mounted to the backplane;
a power supply circuit board mounted in each of the PSUs, the power supply circuit board received by and connected to one of the connector receptacles; and
a management controller circuit board mounted in each of the at least one management controller, the management controller circuit board received by and connected to one of the connector receptacles.

13. The information handling system of claim 12, wherein the power supply circuit board is inserted into a first connector receptacle with a first orientation and the management controller circuit board is inserted into a second connector receptacle with a second orientation, the first and second orientations being inverted relative to each other.

14. The information handling system of claim 12, wherein the PMM further comprises:
a power controller coupled to the backplane, the power controller communicatively coupled to the PSUs, the at least one management controller and an infrastructure manager, the power controller controlling power functions of the PMM.

15. The information handling system of claim 11, further comprising:
one or more busbar segments extending in a direction to intercept a rear of the IT gear inserted into the rack;
at least one power bay busbar connected to the PSUs and positioned at the back of the PMM to electrically connect to the one or more busbar segments to conduct electrical power from at least one of the plurality of PSUs to the IT gear inserted into the rack wherein the IT gear is configured with a power tap to electrically connect to a section of the bus bar segment and distribute received electrical power to the IT gear components.

16. The information handling system of claim 11, wherein the PMM further comprises:
a housing defined by a plurality of walls, the housing enclosing at least one cavity; and
at least one cable routing channel extending through the housing of the PMM for receiving one or more AC power cables.

17. The information handling system of claim 16, further comprising:
an AC switch box;
an AC power receptacle connected to each of the PSUs; and
at least one AC power cable routed through the cable routing channel and having a first end connected to the AC switch box and a second end connected to the AC power receptacle, the AC power cable supplying AC power from the AC switch box to the connected PSUs.

18. The information handling system of claim 16, further comprising:
at least one backup battery connected to the PSUs for supplying backup electrical power to the PSUs.

19. The information handling system of claim 10, wherein the rack has a front side and a back side, with the IT gear slots accessible from the front side and the power and management bay accessible from the back side, such that access to the processing nodes can be inserted to and made accessible from the front side of the rack independent of and without interfering with access to the PMM from the back side of the rack.

20. The information handling system of claim 10, further comprising:
a plurality of slideable rails located within the power and management bay and extending between a front side of the rack and a back side of the rack, the PMM adapted to be received by the slideable rails such that the PMM is moveable between a first extended position outside of the power and management bay and a second retracted position within the power and management bay.

21. A method of constructing a rack-based information handling system, the method comprising:
configuring a rack having adjoined exterior frames that create a volumetric space for receiving a plurality of information technology (IT) gear and other functional components;
defining a plurality of IT gear slots within the volumetric space, each of the IT gear slots configured to receive at least one IT gear;
defining at least one power and management bay within the volumetric space configured as a separate space from the IT gear slots to receive at least one power and management module (PMM); and
mounting the at least one power and management module (PMM) into the at least one power and management bay, the PMM providing scalable power distribution and rack-level management functions that are shared by the plurality of IT gear inserted into the IT gear slots, wherein the PMM comprises:
an infrastructure manager circuit board connected to the management controller by at least one Ethernet cable; and
at least one Ethernet connector mounted to the infrastructure manager circuit board, the Ethernet connector facing toward a back side of the rack, the Ethernet connector connected to a second Ethernet cable having an allocated global throttle wire directly connecting each block controller within the IHS with the management controller, wherein the block controllers within the IHS are pre-programmed to respond to an assertion of a signal on the global throttle wire by the management controller by immediately throttling operations of one or more processing nodes within a respective block being controlled by the block controller.

22. The method of claim 21, further comprising:
mounting a plurality of power supply units (PSUs) into the PMM, wherein the number of PSUs is scalable based on the number of IT gear; and
mounting at least one management controller into the PMM, wherein the at least one management controller provides rack-level management of the IT gear and at least one associated block controller within the information handling system.

* * * * *